United States Patent [19]
Gose et al.

[11] Patent Number: 5,675,297
[45] Date of Patent: Oct. 7, 1997

[54] INTEGRATED PULSE-WIDTH MODULATION CIRCUIT WITH THERMAL SHUTDOWN CIRCUIT

[75] Inventors: Mark Wendell Gose; John Mark Dikeman, both of Kokomo; Jerry William Campbell, Carmel, all of Ind.

[73] Assignee: Delco Electronics Corporation, Kokomo, Ind.

[21] Appl. No.: 639,389

[22] Filed: Apr. 29, 1996

[51] Int. Cl.⁶ ........................................ H03K 7/08
[52] U.S. Cl. ................ 332/109; 332/110; 375/238
[58] Field of Search .................. 332/109, 110; 375/238

[56] References Cited

U.S. PATENT DOCUMENTS 5,461,303 10/1995 Leman et al. ................. 323/222
5,485,487 1/1996 Orbach et al. ................ 332/109

*Primary Examiner*—Siegfried H. Grimm
*Attorney, Agent, or Firm*—Jimmy L. Funke

[57] ABSTRACT

An integrated pulse-width modulation circuit with conditional temperature protection circuitry includes logic circuitry, a power output device, thermal shutdown circuitry to disable the power output device when the die temperature exceeds a predetermined limit, and a masking circuit that disables the thermal shutdown circuit during short term thermal increases such as those that occur when an inductive load turn off event takes place.

12 Claims, 4 Drawing Sheets

INTEGRATED PULSE-WIDTH MODULATION CIRCUIT WITH THERMAL SHUTDOWN CIRCUIT

FIELD OF THE INVENTION

This invention relates in general to electronic devices and more specifically to an integrated circuit device that includes logic circuitry and one or more power output devices.

BACKGROUND OF THE INVENTION

Integrated circuits that incorporate both digital and analog circuitry are well known in the art. Logic circuitry and power output devices are often combined into a single integrated circuit (hereinafter "IC") to form a circuit that provides customized functionality. Customized functionality IC's are oftentimes needed as interface circuits, providing an interface between a logic controller such as a microprocessor and devices that require high power activation signals, such as relays, incandescent lamps and the like.

As technologies mature, and IC die geometries grow smaller, power devices are requiring less area to meet the same on resistance capability. Smaller power devices result in increased thermal rises because the power is distributed across smaller device areas. The thermal time constant of a device $RC_{th}$, defines the time required to cool/heat the device, and is proportional to 1 over the device area. In the case of an IC design incorporating a power output device, such as a high current capability MOSFET (metal oxide semiconductor field effect transistor) device or other similar power output device, an IC designer must accommodate the power dissipation factors associated with the MOSFET device into the design of the IC die. Increased power handling capability requires that the die size be larger to dissipate the additional heat generated by higher current levels in the circuitry. The traditional method of maintaining a desired pulse-width-modulation (hereinafter PWM) without thermal interference is to make the power device larger to decrease thermal resistance. Thus, a significant die size design limitation is introduced into the IC design process when a power output device is included as a part of the IC circuitry.

It is also common practice to incorporate shorted load fault protection circuitry and thermal shutdown protection circuitry into a PWM driver IC to prevent damage to the power output device in the event a short circuit or over-temperature condition exists, thereby protecting the IC from permanent damage under such conditions. When the power output device supplies a power signal to an inductive load, it is well known that a flyback voltage is created when current supplied to the load is abruptly terminated, causing a momentary increased power level that may trigger the thermal protection circuitry to shutdown the power output device. One design alternative is to maintain a continuous thermal shutdown temperature level and to enlarge the power device area to reduce the peak temperatures seen during the high power transients from the inductive flyback. A larger die size can significantly increase the fabrication cost of an IC, or may require heat sink devices attached to the IC packaging to improve heat dissipation in using the IC in a particular application.

Today's sub-micron IC fabrication technologies enable inclusion of significant additional logic circuitry with a minimal impact on the die size of an IC. A combination logic/power interface IC device that includes over-current protection circuitry, thermal protection circuitry and a masking circuit to momentarily disable the thermal protection circuitry in order to accommodate inductive load turn off conditions or current peaks and that has a reduced die size is thus needed.

SUMMARY OF THE INVENTION

An integrated pulse-width modulation circuit according to one aspect of the present invention comprises a pulse-width modulation circuit having a PWM output at which a PWM signal is produced, and a masking output at which a masking signal is produced, the pulse-width modulation circuit also including a PWM disable input, wherein the masking signal is produced a predetermined time period prior to a transition of the PWM signal, and wherein the PWM signal is disabled in response to signals supplied to the PWM disable input, a power output device connected to the PWM output and responsive to the PWM signal to produce a switching power signal in accordance with the PWM signal, a thermal shutdown circuit including a TSD output connected to the PWM disable input, the thermal shutdown circuit responding to the temperature of the integrated pulse-width modulation circuit, the thermal shutdown circuit producing a TSD signal at the TSD output when the temperature of the integrated pulse-width modulation circuit exceeds a predetermined temperature, the thermal shutdown circuit also including a TSD disable input wherein the TSD output is disabled and the TSD signal is disabled in response to signals supplied to the TSD disable input, and a TSD masking circuit, the TSD masking circuit supplying a predetermined duration TSD disable signal to the TSD disable input in accordance with the masking signal.

One object of the present invention is to provide an improved PWM IC.

Another object of the present invention is to reduce the die size of a PWM IC by including conditional thermal shutdown circuitry.

Yet another object of the present invention is to mask or disable thermal shutdown signals for a predetermined time interval at PWM turnoff to prevent flyback voltages from triggering a thermal shutdown that can be withstood by the IC geometry.

Still another object of the present invention is to provide short circuit protection, current limit protection, and thermal shutdown protection in a PWM IC including a power output device capable of driving an inductive load, and wherein the die size is reduced as a result of a conditional masking of the thermal shutdown protection circuitry.

These and other objects of the present invention will become more apparent from the following description of the preferred embodiment.

DESCRIPTION OF THE PREFERRED EMBODIMENT

Figure 1:
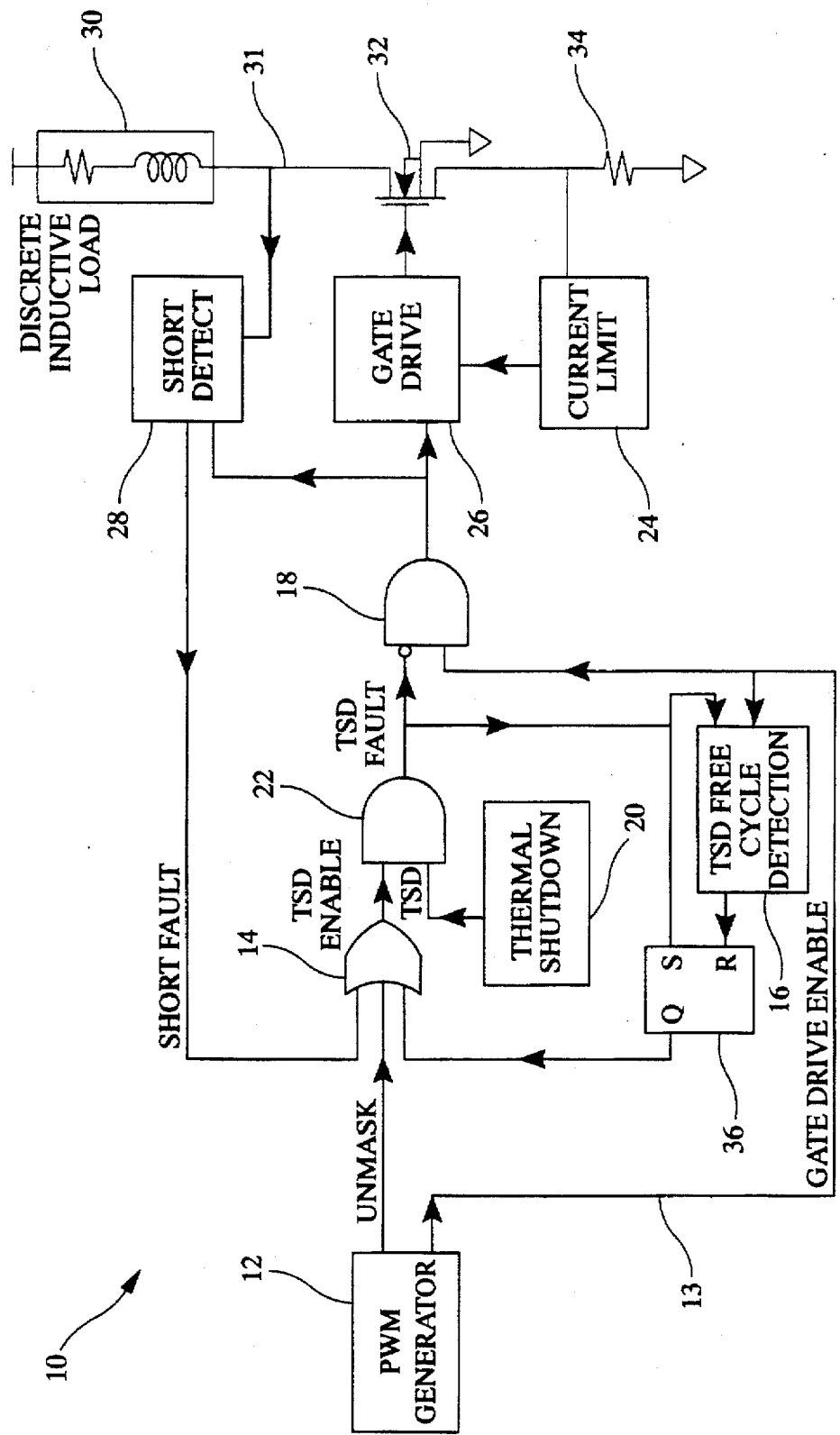
FIG. 1 is a block diagram of an integrated circuit with a conditional temperature protection circuit according to the present invention.

For the purposes of promoting an understanding of the principles of the invention, reference will now be made to the embodiment illustrated in the drawings and specific language will be used to describe the same. It will nevertheless be understood that no limitation of the scope of the invention is thereby intended, such alterations and further modifications in the illustrated device, and such further applications of the principles of the invention as illustrated therein being contemplated as would normally occur to one skilled in the art to which the invention relates.

Referring now to FIG. 1, a block diagram of an integrated circuit with conditional protection circuitry 10 is shown. PWM generator circuit 12 supplies a gate drive enable signal or PWM signal via signal path 13 to TSD free cycle detection circuit 16 and AND gate 18. PWM generator circuit 12 also produces an unmask signal that is supplied to OR gate 14. Thermal shutdown circuit 20 produces a thermal shutdown (hereinafter referred to as "TSD") signal that is supplied to one input of AND gate 22 to indicate the temperature of the IC die has exceeded a predetermined design limit. The thermal shutdown circuit 20 includes circuitry for detecting IC die temperature and producing a TSD fault signal when the IC die temperature exceeds a predetermined temperature limit. Such temperature detection circuits are well known in the art of IC design and are implemented using a single diode voltage drop measurement technique or a two diode delta-voltage drop comparison method wherein one diode is located adjacent the power output device (such as device 32) and a second diode is located away from the power device, and a predetermined difference in the forward voltage drop across each of the two diodes indicates an over-temperature or thermal shutdown condition. OR gate 14 produces a TSD enable signal that is supplied to the second input of AND gate 22. AND gate 22 produces a TSD fault signal that is supplied to an inverting input of AND gate 18. AND gate 18 supplies a signal to short detect circuit 28 and gate drive circuit 26. Current limit circuit 24 supplies a disable signal to gate drive circuit 26 when the voltage across resistor 34 exceeds a voltage determined at design time that protects power device 32 (shown as a MOSFET power device in FIG. 1) from excess current levels. Short detect circuit 28 senses a voltage at signal path 31, connecting load 30 and device 32. Short detect circuit 28 supplies a short fault signal to an input of OR gate 14 if a short circuit condition or low impedance is detected at 31. Load 30 consists of inductive and resistive components as shown in the diagrammatic illustration. Load 30 is not a component of the IC 10, but rather is an external device connected via wiring or the like to IC 10. Latch 36 provides a signal at a Q output thereof to an input of OR gate 14 if a TSD fault signal is received at the SET input S from AND gate 22. The Q output of Latch 36 is reset when a logic high signal is supplied to the reset input R of latch 36 by the TSD free cycle detection circuit 16.

Operationally speaking, a PWM drive signal is supplied to device 32 to switch power on and off to load 30 in accordance with the frequency and duty cycle programming of PWM generator circuit 12. Since load 30 has an inductive component, the flyback voltage at signal path 31 may be quite high when the energy stored in the inductor of load 30 is released. The flyback voltage occurs when device 32 switches off and current flow through load 30 is interrupted. The additional power that must be dissipated at the moment of device 32 turn-off raises the temperature of the IC die that includes the logic and analog circuitry of FIG. 1 (except for load 30) and triggers the activation of thermal shutdown circuit 20. Under normal operating conditions (no TSD fault) AND gate 18 merely passes the gate drive enable or PWM signal from PWM generator circuit 12 directly to gate drive circuit 26. When thermal shutdown circuit 20 is activated due to excessive die temperature or a TSD fault condition, a TSD signal is generated by circuit 20 and supplied to AND gate 22, the net effect being that the gate drive enable signal of signal path 13 from PWM generator circuit 12 is prevented from reaching gate drive circuit 26 thereby disabling device 32 from conducting current.

The flyback voltage phenomenon that is characteristic of driving an inductive load provides the IC designer with two known choices: either increase the power device area so that the transient temperature rise is decreased to reduce the peak die temperature, or increase the TSD threshold of the thermal shutdown circuit 20. However, increasing the TSD threshold allows the steady state temperature to reach levels that reduce IC and package reliability.

A third alternative, conditionally disabling the TSD fault signal from deactivating the gate drive circuitry 26, is achieved by the inclusion of the TSD free cycle detection circuit 16, latch 36, and additional logic circuitry added to a typical PWM generator circuit to produce an unmask signal that is supplied to OR gate 14.

Figure 2:
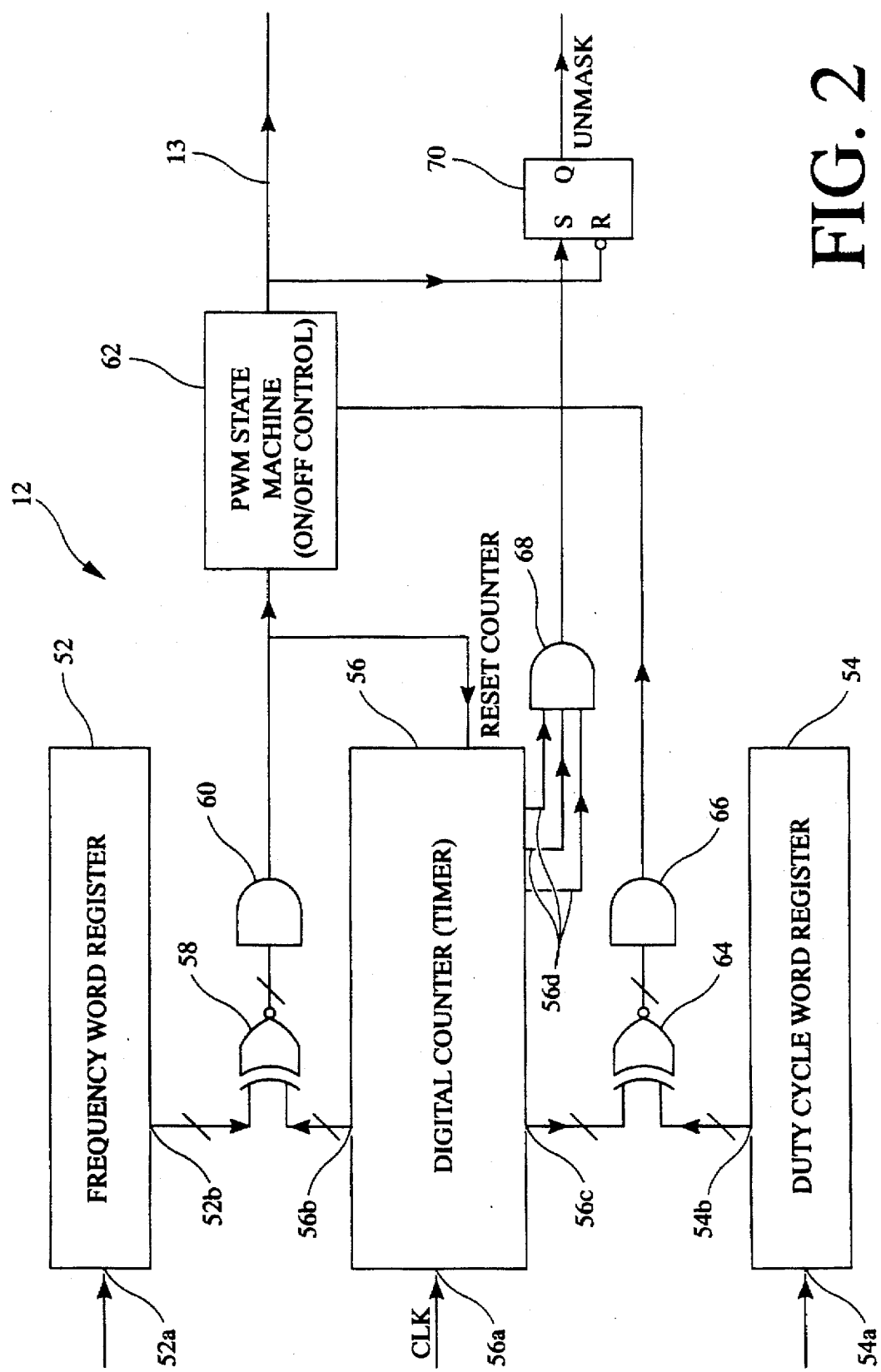
FIG. 2 is a block diagram of the PWM generator of FIG. 1.

Referring now to FIG. 2, the PWM generator circuit 12 of FIG. 1 is shown in more detail. The circuit includes a frequency word register 52, a duty cycle word register 54, a digital counter/timer 56, XNOR gates 58 and 64, bit compare gates 60 and 66, a PWM state machine on/off control circuit 62, a bit decode AND gate 68, and an R/S latch 70. A frequency data signal is supplied to the frequency word register at a word input 51a to program a desired frequency digital word (typically 16 bits of data) value into the frequency word register 52. Likewise, a duty cycle data signal is supplied to the word input 54a to program the duty cycle word register 54 with a desired duty cycle digital value. The frequency data signal and the duty cycle data signal are typically received as serial data that is "clocked" into the registers 52 and 54. Other mechanisms for programming registers 52 and 54 are well known in the art and need not be discussed at this time. A clock signal is supplied to the CLK input 56a of the digital counter/timer 56. XNOR gates 58 and 64 are illustrative of the typical circuitry used to compare the logic signals representing the current count of the digital counter 56 with the data programmed into the registers 52 and 54. For example, if the digital counter were a 4-bit counter, then four XNOR gates are required to compare the data in register 52 represented at outputs 52b with the counter outputs 56b. Similarly four XNOR gates are required to compare the data in register 54 represented at outputs 54b with the counter outputs 56c. In both the frequency word register compare circuitry, including XNOR gates 58 and AND gate 60, and the duty cycle compare circuitry, comprised of XNOR gates 64 and AND gate 66, the width of the signal path buses equals the number of digital bits of data. Such digital array compare circuitry is quite well known in the art. The outputs of AND gates 60 and 66 are supplied to a PWM state machine that produces a PWM signal in accordance with the programming of the frequency and duty cycle registers and the clock rate of the signal supplied to the digital counter/timer 56 at input 56a.

Operationally speaking, the frequency word register 52 and the duty cycle word register 54 are programmed with data to achieve a particular frequency and duty cycle signal based upon the clock rate of the signal supplied to the CLK input 56a. PWM state machine 62 produces a PWM signal or gate drive enable signal that is supplied to the TSD free cycle detection circuit 16 and AND gate 18, both shown in FIG. 1. Selected counter bit signals of the digital counter/timer counting circuitry are made available at outputs 56d and supplied to the inputs of AND gate 68. The signals at outputs 56d are binary counting data signals and are chosen so that the time at which all of the signals at outputs 56d are logic high corresponds to a desired $RC_{th}$ masking time. When the output of AND gate 68 is at logic high, indicating a predetermined $RC_{th}$ time in the current PWM cycle has expired, R/S latch 70 forces the Q output of latch 70 high thus supplying an unmask signal to OR gate 14 (FIG. 1) and producing a logic high at the output of OR gate 14. The PWM state machine 62 resets the Q output of R/S latch 70 to a logic low when the PWM gate drive enable signal of signal path 13 changes from a logic high to a logic low state, thereby preventing or masking a TSD fault via OR gate 14 and AND gate 22 (FIG. 1) from the time the PWM gate drive enable signal at 13 is switched to a logic zero state to a time equal to $RC_{th}$ after the PWM gate drive enable signal is at a logic high state. This signal, produced at the output of latch 70, is the TSD unmask signal. Thus a TSD unmask signal logic low state propogates through OR gate 14 to make the TSD enable signal a logic low during the interval in time in which a flyback voltage is introduced into circuit 10 (device 32, specifically) by load 30.

Figure 3:
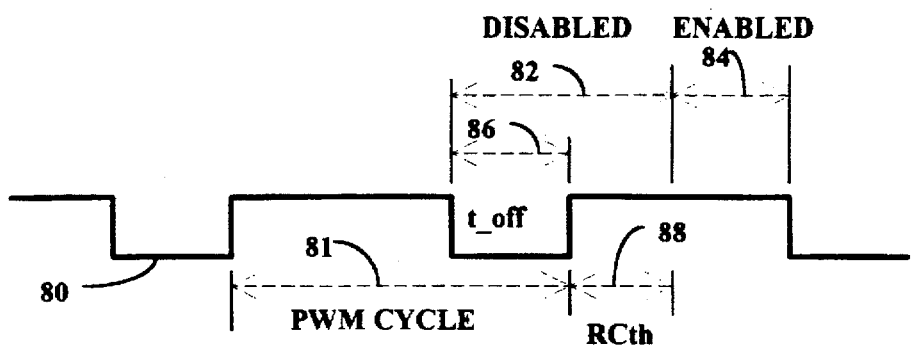
FIG. 3 is a signal timing diagram depicting the PWM waveform and the timing and duration of the TSD disable signal with respect to the output of the PWM generator circuit.

Referring now to FIG. 3, a waveform 80 produced by the PWM generator circuit 12 of FIG. 1 (and that corresponds with the PWM gate drive enable signal) is shown depicting the timing of the TSD disable signal (TSD mask signal) with respect to the PWM gate drive enable signal waveform 80. Waveform 80 is a periodic waveform comprised of repeating segments identical to the waveform defined at the time period designated 81. The waveform segment identified at 82 depicts the TSD disable signal or TSD masking signal presence. The TSD disable signal is activated to mask a TSD fault when the PWM waveform 80 transitions from a logic high to a logic low state. The TSD disable signal persists until the expiration of a $RC_{th}$ time period identified at 88. For each cycle of the PWM gate drive enable signal, the TSD disable signal is generated as shown. Thus, the duration of the TSD disable signal corresponds to the sum of the t_off signal time 86 plus the $RC_{th}$ time period 88.

Figure 4:
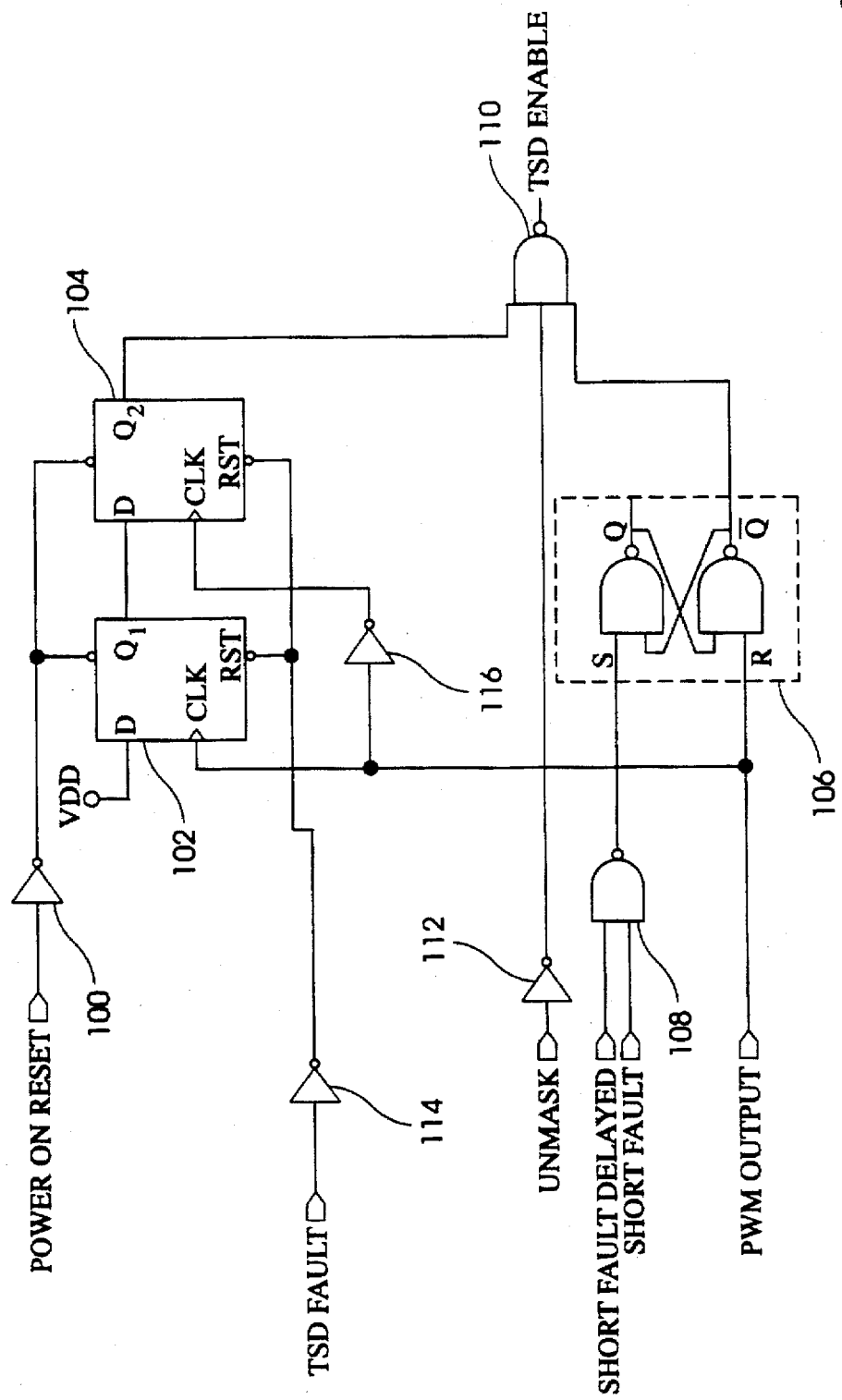
FIG. 4 is a logic circuit schematic depicting one embodiment of the short fault and TSD free cycle detection circuitry of FIG. 1.

Referring now to FIG. 4, a logic circuit schematic is shown that details one embodiment of the TSD free cycle detection block 16, gate 14, short detect block 28 and R/S latch 36 of FIG. 1. A power on reset pulse signal is supplied to the input of inverter 100 at power up. Inverter 100 inverts the signal and supplies an inverted reset pulse signal to the SET inputs of D flip-flops 102 and 104. Thus, Q1 output of flip-flop 102 and Q2 output of flip-flop 104 are preset to a logic high at power on.

The PWM signal or gate drive enable signal, signal path 13 in FIGS. 1 and 2, is supplied to the RESET input of NAND latch 106. NAND gate 108 implements some of the functionality of the short detect block 28 of FIG. 1. At one input of gate 108 is a logic signal indicating a short fault has occurred. A "short fault" is detected by comparing the gate voltage and the drain voltage. More specifically, the gate voltage and drain voltage signals are typically level adjusted or buffered for compatibility with logic gate signal levels, and a "short fault" is indicated when the gate signal is logic high and the drain signal is also logic high, indicating the load 30 is shorted out and thus the drain is high even though the power device is turned on. Due to the time delay typical of the drain voltage to react to gate drive signals, a time delay device (such as a capacitor or a digital counter preloaded to trigger an output signal upon reaching a predetermined count) is necessary so that when the gate drive signal goes high, switching the output device into the on state or conducting state, a fault is not indicated unless the fault signal is still present after a predetermined "short fault" time delay. The second input of gate 108, a "short fault" delayed signal, is logic high only if the "short fault" exists for more than a predetermined time period corresponding to the time necessary for the voltage at the drain of device 32 to fall and provide a signal sufficient to indicate load 30 is not shorted. If the "short fault" delayed signal and the "short fault" signal at the inputs of gate 108 are both high, a "short fault" is indicated, and latch 106 is set, causing latch 106 to supply a low signal to an input of NAND gate 110.

At a second input of gate 110 is an inverted unmask signal output from gate 112, which is a logical inversion of the unmask signal output of latch 70 of FIG. 2. When the inverted unmask signal is low, the TSD enable signal at the output of gate 110 is true or logic high.

A third input of gate 110, or the third possible source of a signal to enable the TSD enable signal, is connected to the Q2 output of flip-flop 104. Inverter 114 inverts the TSD fault signal and supplies an inverted TSD fault signal to a low true RESET input of flip-flop 102. The PWM gate drive enable signal from PWM state machine 62 provides a clock signal to the CLK input of flip-flop 102, and the inverted PWM gate drive enable signal from inverter 116 provides a clock signal to the CLK input of flip-flop 104. If a thermal shutdown fault occurs at a time other than the anticipated masking time ($RC_{th}$) of the flyback voltage associated with the release of energy from load 30, the Q2 output of flip-flop 104 is reset low, as is Q1 of flip-flop 102, and the output of gate 110, which is currently a logic high as a result of one or both of the other two inputs to 110, is effectively latched to a logic high. This prevents the TSD enable signal at the output of gate 110 from going low when the next masking period occurs (note that the output of gate 110 corresponds with the output of gate 14 of FIG. 1). Since the output of gate 110 is supplied to AND gate 22 of FIG. 1, the output of AND gate 22 will continue to indicate the TSD fault, maintaining thermal shutdown of the device 32 until the TSD circuit 20 TSD signal is false. When the output of gate 22 is at a logic high, the output of gate 18 is disabled, and the gate drive signal of signal path 13 does not reach the gate drive block 26.

Figure 5:
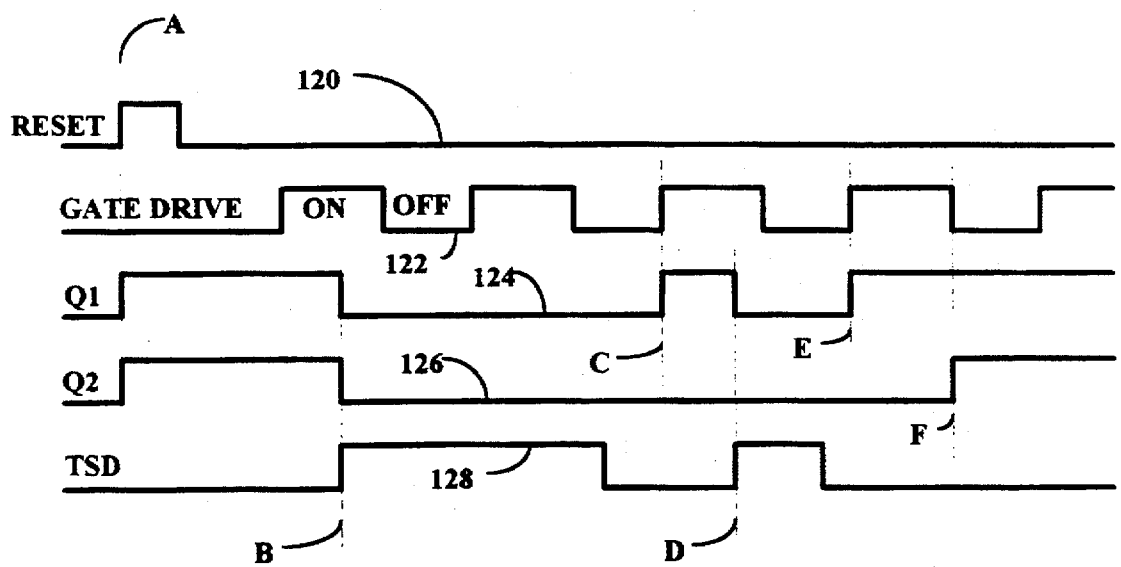
FIG. 5 is a signal timing diagram depicting several signal waveforms relating to the operation of the circuit shown in FIG. 4.

Referring now to FIG. 5, a logic signal timing diagram is shown that depicts the relationship of the power on reset signal indicated by curve 120, the gate drive enable signal (or PWM signal) indicated by curve 122, the Q1 output of flip-flop 102 indicated by curve 124, the Q2 output of flip-flop 104 indicated by curve 126, and the TSD signal (output signal from block 20 of FIG. 1) indicated by curve 128. At power on of the entire integrated circuit 10, the power on reset signal 120 forces the Q1 signal (curve 124) and the Q2 signal (curve 126) to logic high at A. When a TSD condition occurs at B the Q1 and Q2 outputs of flip-flops 102 and 104, respectively, are forced low. Thus, the Q2 output of flip-flop 104 (curve 126) changes to a logic low, the TSD enable signal supplied to gate 22 was and is at logic high, and a true TSD fault (the output of gate 22 is high) will continue to disable the output of gate 18. At C, if the TSD signal (curve 128) is no longer at logic high because the TSD signal from 20 is at logic low (a "die temperature down" condition), a logic high is clocked onto the output Q1 (curve 124). At D, a TSD signal (curve 128) reoccurs, and the Q1 signal (curve 124) is reset low. At E, the TSD signal (curve 128) is again inactive low, and a logic high is again clocked onto the Q1 output (curve 124). When the gate drive signal (curve 122) changes to logic low at F, the Q1 signal state (curve 124) is clocked to the Q2 output of flip-flop 104 since the TSD signal (curve 128) remains low during the entire "on-time" of the PWM signal cycle. Generally speaking, a TSD that is not masked by the unmask signal from latch 70 will disable the gate drive enable signal from reaching the gate drive block 26. Should the TSD condition disappear, the output of gate 22 or the TSD fault goes to logic low and the gate drive enable signal at 13 is once again supplied by AND gate 18 to gate drive block 26. However, the circuitry of FIG. 4 latches the TSD enable signal (output of gate 110) active once an unmasked TSD condition (an output from block 20 of FIG. 1) activates a TSD fault via gate 22 (FIG. 1), thereby overriding future masking signals which would otherwise make the TSD enable signal (output of gate 14 in FIG. 1) inactive during the mask time. This is done to be more sensitive (no mask time to wait for) to TSD signals when a TSD has recently taken place. Once a complete PWM on-time cycle has occurred without a TSD signal, the TSD enable signal is unlatched (Q2 of device 110 is inactive high) and can once again be forced inactive by a low signal or inactive state on the unmask signal during the mask time.

While the invention has been illustrated and described in detail in the drawings and foregoing description, the same is to be considered as illustrative and not restrictive in character, it being understood that only the preferred embodiment has been shown and described and that all changes and modifications that come within the spirit of the invention are desired to be protected.

The embodiments of the invention in which an exclusive property or privilege is claimed are defined as follows:

1. An integrated pulse-width modulation circuit comprising:
    a pulse-width modulation circuit having a PWM output at which a PWM signal is produced, and a masking output at which a masking signal is produced, said pulse-width modulation circuit also including a PWM disable input, wherein said masking signal is produced a predetermined time period prior to a transition of said PWM signal, and wherein said PWM signal is disabled in response to signals supplied to said PWM disable input;
    a power output device connected to said PWM output and responsive to said PWM signal to produce a switching power signal in accordance with said PWM signal;
    a thermal shutdown circuit including a TSD output connected to said PWM disable input, said thermal shutdown circuit responding to the temperature of the integrated pulse-width modulation circuit, said thermal shutdown circuit producing a TSD signal at said TSD output when the temperature of the integrated pulse-width modulation circuit exceeds a predetermined temperature, said thermal shutdown circuit also including a TSD disable input wherein said TSD output is disabled and said TSD signal is disabled in response to signals supplied to said TSD disable input; and
    a TSD masking circuit, said TSD masking circuit supplying a predetermined duration TSD disable signal to said TSD disable input in accordance with said masking signal.

2. The device of claim 1 including a short fault detect circuit that produces a short fault signal when said power switching signal is shorted to ground, and wherein said short fault signal is supplied to said PWM disable input of said pulse-width modulation circuit.

3. The device of claim 2 wherein said pulse-width modulation circuit includes a digital counter and wherein said masking signal is produced when a masking digital count is reached by said digital counter.

4. The device of claim 3 wherein said power output device is a MOSFET power output device.

5. The device of claim 3 including an over-current detection circuit, said over-current detection circuit detecting the current flowing through said power output device, and wherein said over-current detection circuit supplies an over-current signal to said PWM disable input when current flowing through said power output device exceeds a predetermined current limit.

6. The device of claim 5 wherein said pulse-width modulation circuit includes a frequency register having a frequency signal input, a duty cycle register having a duty cycle input, and wherein a frequency signal supplied to said frequency signal input determines the frequency of said PWM signal, and a duty cycle signal supplied to said duty cycle input determines the duty cycle of said PWM signal.

7. An integrated pulse-width modulation circuit comprising:
    PWM circuit means for producing a PWM signal, said PWM circuit means having a PWM output at which a PWM signal is produced, and a masking output at which a masking signal is produced, said PWM circuit means also including a disable input, wherein said masking signal is produced a predetermined time period prior to a high to low transition of said PWM signal, and wherein said PWM signal is disabled in response to signals supplied to said PWM disable input;
    a power output device connected to said PWM output and responsive to said PWM signal to produce a switching power signal in accordance with said PWM signal;
    thermal shutdown circuit means for producing a thermal shutdown signal, said thermal shutdown circuit including a TSD output connected to said PWM disable input, said thermal shutdown circuit means responding to the temperature of the integrated pulse-width modulation circuit, said thermal shutdown circuit means producing a TSD signal at said TSD output when the temperature of the power output device exceeds a predetermined temperature, said thermal shutdown circuit means also including a TSD disable input wherein said TSD output is disabled and said TSD signal is disabled in response to signals supplied to said TSD disable input; and a TSD masking circuit, said TSD masking circuit supplying a predetermined duration TSD disable signal to said TSD disable input in accordance with said masking signal.

8. The device of claim 7 including a short fault detect circuit means for detecting a short fault of said power output device, wherein said short fault detect circuit means produces a short fault signal when said power switching signal is shorted to ground, and wherein said short fault signal is supplied to said PWM disable input of said pulse-width modulation circuit.

9. The device of claim 8 wherein said PWM circuit means includes a digital counter and wherein said masking signal is produced when a masking digital count is reached by said digital counter.

10. The device of claim 9 including an over-current detection circuit means for detecting over-current conditions in said power output device, and wherein said over-current detection circuit means supplies an over-current signal to said PWM disable input when current flowing through said power output device exceeds a predetermined current limit.

11. The device of claim 10 wherein said PWM circuit means includes a frequency register having a frequency signal input, a duty cycle register having a duty cycle input, and wherein a frequency signal supplied to said frequency signal input determines the frequency of said PWM signal, and a duty cycle signal supplied to said duty cycle input determines the duty cycle of said PWM signal.

12. The device of claim 11 wherein said power output device is a MOSFET power output device.

\* \* \* \* \*